United States Patent [19]

Ishigaki et al.

[11] 4,021,749
[45] May 3, 1977

[54] SIGNAL AMPLIFYING CIRCUIT

[75] Inventors: Yoshio Ishigaki, Tokyo; Masayuki Hongu, Komae; Takashi Okada, Yamato, all of Japan

[73] Assignee: Sony Corporation, Tokyo, Japan

[22] Filed: Feb. 6, 1975

[21] Appl. No.: 547,583

Related U.S. Application Data

[63] Continuation of Ser. No. 381,576, July 23, 1973, abandoned.

[30] Foreign Application Priority Data

July 22, 1972 Japan .............................. 47-73584
July 22, 1972 Japan .............................. 47-73585
July 22, 1972 Japan .............................. 47-73586

[52] U.S. Cl. .................................. 330/22; 330/18; 330/19; 330/40
[51] Int. Cl.² ........................................ H03F 3/04
[58] Field of Search ............. 330/18, 19, 22, 38 M, 330/40

[56] References Cited
UNITED STATES PATENTS

| | | |
|---|---|---|
| 2,888,525 | 5/1959 | Eckess et al. .................... 330/18 X |
| 3,500,220 | 3/1970 | Buckley ........................... 330/38 M |
| 3,551,832 | 12/1970 | Graeme ......................... 330/30 D X |
| 3,566,293 | 2/1971 | Von Recklinghausen ....... 330/22 X |
| 3,701,032 | 10/1972 | Steckler ............................... 330/18 |

Primary Examiner—Rudolph V. Rolinec
Assistant Examiner—Lawrence J. Dahl
Attorney, Agent, or Firm—Lewis H. Eslinger; Alvin Sinderbrand

[57] ABSTRACT

A signal amplifying circuit including an amplifying transistor having its base-emitter terminals connected to a signal source. A diode having the proper characteristics is also connected across the base-emitter input terminals to produce a first reference bias voltage to be applied to the input circuit of the transistor. The emitter-collector circuit of a compensating transistor is connected in series with the emitter-collector circuit of the amplifying transistor, and a second reference bias voltage is connected between the base of the compensating transistor and the emitter of the amplifying transistor. The second reference bias voltage is produced across a plurality of diodes having the proper characteristics, whereby the current gain of the amplifier will be constant regardless of variations in the transistor characteristics.

14 Claims, 8 Drawing Figures

SIGNAL AMPLIFYING CIRCUIT

This is a continuation of application Ser. No. 381,576, filed July 23, 1973, now abandoned.

BACKGROUND OF THE INVENTION

Field of the Invention

This invention relates to a signal amplifying circuit, preferably of the type used in an integrated circuit device. In particular, it relates to an improved signal amplifying circuit having stabilized amplifying characteristics.

The Prior Art

This invention relates to signal amplifying circuits and gain control circuits of the type shown in the copending U.S. patent application Ser. No. 336,820, filed Feb. 28, 1973 and assigned to the same assignee as the present case. A basic amplifying circuit in that application included an amplifying transistor having its base-emitter terminals connected to a signal source. The source included a voltage source connected in series with a resistor having a relatively high impedance, so that the signal source was essentially a constant current source. A suitable diode in the form of a diode-connected transistor, preferably having base-emitter characteristics identical with those of the amplifying transistor, was connected in parallel with the input circuit of the amplifying transistor. A load resistor was connected in series with the collector terminal of the emitter-collector output circuit of the amplifying transistor.

The input current flowing through the diode-connected transistor should be substantially the same as the output current flowing through the load resistor because the base-emitter voltage of the diode connected transistor is substantially equal to the base-emitter voltage of the amplifying transistor. Accordingly, the current gain $\beta$, which is the ratio of the output current to the input current of the circuit, should be approximately equal to one. However, there is difficulty in making the characteristics of the diode-connected transistor sufficiently identical with the characteristics of the input circuit of the amplifying transistor in integrated circuit devices built through the use of mass production techniques. As a result, the current gain $\beta$ varies widely.

Accordingly, it is one object of the present invention to provide an improved signal amplifying circuit that overcomes the disadvantages of the prior art circuit. In particular, it is an object of the present invention to provide a signal amplifying circuit suitable for incorporation in an integrated circuit device.

A further object of the invention is to provide a signal amplifying circuit having stabilized amplifying characteristics.

A still further object of the invention is to provide a signal amplifying circuit suitable for use in a gain control circuit.

SUMMARY OF THE INVENTION

According to the present invention, a signal from a constant current source is connected to the base-emitter input terminals of an amplifying transistor. A reference voltage circuit comprising a diode having the proper voltage-current characteristics is also connected across the base-emitter input terminals. Normally, in an integrated circuit device, the diode would be a diode-connected transistor having the same voltage-current characteristics as the amplifying transistor and having its base and collector terminals connected together to the base of the amplifying transistor.

In order to avoid the variation in current amplification due to mismatch between the voltage-current characteristics of the diode and the amplifying transistor, the emitter-collector circuit of another transistor is connected in series between the collector emitter of the amplifying transistor and the load impedance, and a bias circuit includes two diodes, or diode-connected transistors connected in series between the base of the compensating transistor and ground.

The base-emitter voltage of the compensating transistor is substantially equal to the base-emitter voltage of each of the diode-connected transistors and is also substantially equal to the collector-emitter voltage and to permit a change in the base-emitter voltage of the amplifying transistor change the gain of the amplifier without changing the amplifying characteristics.

DETAILED DESCRIPTION OF THE INVENTION

Figure 1:
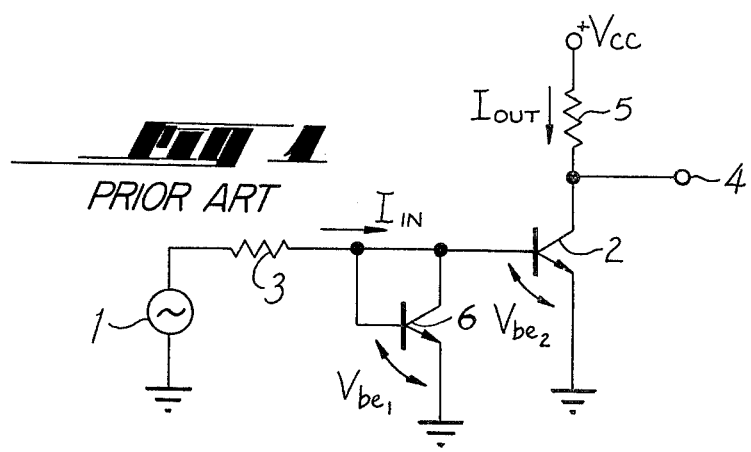
FIG. 1 is a schematic diagram showing a signal amplifying circuit of the prior art.

In the prior art signal amplifying circuit shown in FIG. 1, a signal input source 1 is connected to the base of an amplifying transistor 2 by means of a resistor that has a relatively high resistance so that, together with the source 1, it becomes a constant current source. A signal output terminal 4 is connected to the collector of the transistor 2, and a load resistor 5 is connected in series between the collector of the transistor 2 and the power supply voltage terminal $+V_{cc}$. The emitter of the transistor 2 is connected to a reference voltage source, which is a transistor 6 connected as a diode with the emitter connected to ground and the base and collector directly connected together to the base of the transistor 2.

In an amplifying circuit of the type shown in FIG. 1, the input current $I_{in}$ that flows through the transistor 6 should be substantially equal to the output current $I_{out}$ flowing through the load resistor 5. This is because the base-emitter voltage $V_{be_1}$ of the diode-connected transistor 6 is equal to the base-emitter voltage $V_{be_2}$ of the transistor 2. Accordingly, the current gain $\beta$ of the circuit will be $$\beta = I_{out}/I_{in} \approx 1 \tag{1}$$

A disadvantage of the circuit in FIG. 1 when it is incorporated in an integrated circuit device and produced by mass production techniques is that the current gain $\beta$ varies widely. This is due to the fact that the relationship between the base-emitter voltage $V_{be}$ and the emitter current $1_e$ of the transistor 2 is not precisely equal to that of the transistor 6.

Figure 2:
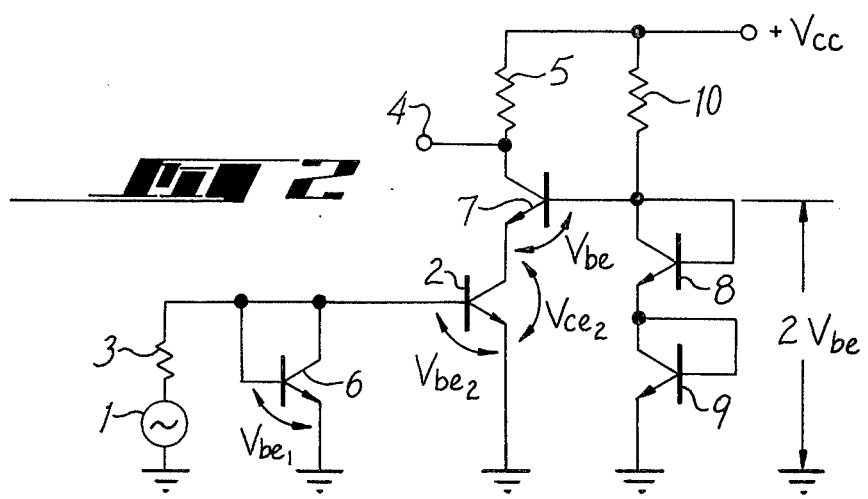
FIG. 2 is a schematic diagram of a signal amplifying circuit according to one embodiment of the present invention.

The disadvantages of the circuit in FIG. 1 are substantially overcome in the circuit in FIG. 2. The similarity between the circuits is illustrated by the fact that corresponding components are identified by the same reference numerals. The circuit in FIG. 2 includes in addition, a transistor 7 having its emitter-collector circuit connected in series with the emitter-collector circuit of the transistor 2 between the collector of the latter transistor and the output terminal 4. In addition, the circuit in FIG. 2 includes two diode-connected transistors 8 and 9 connected in series between the base of the transistor 7 and ground, and it also includes a resistor 10 connecting the base of the transistor 7 to the power supply terminal $+V_{cc}$. The diode-connected transistors 8 and 9 and the resistor 10 supply the base of the transistor 7 with a bias voltage such that the collector-emitter voltage of the transistor 2 is substantially equal to the forward voltage of the diode element. That is, the collector-emitter voltage $V_{ce_2}$ of the transistor 2 is substantially equal to the voltage $V_{be_1}$ and to the voltage $V_{be_2}$. It is also substantially equal to the voltage $V_{be}$ between the base and the emitter of the transistor 7. Thus, the voltage across the two diode-connected transistors 8 and 9 is $2V_{be}$.

Since the base potential of the transistor 2 is substantially equal to that of the transistor 6, and the collector-emitter voltage of the transistor 2 is substantially equal to the base-emitter voltage $V_{be_1}$ of the transistor 6, the relationship between the base-emitter voltage $V_{be}$ and the emitter current $I_e$ of the transistors 2 and 6 will be substantially identical. As a result, the input current $I_{in}$ flowing through the transistor 6 will be perfectly equal to the output current $I_{out}$ flowing through the transistors 2 and 7 and the load resistor 5, and the current gain $\beta$ of the circuit will be $\beta = 1$, regardless of the transistor characteristics.

Figure 3:
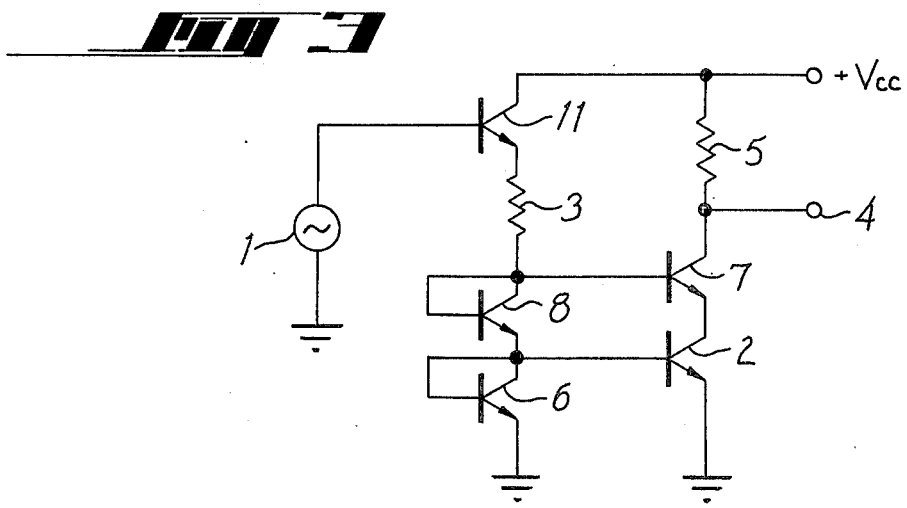
FIGS. 3 and 4 are schematic diagrams showing additional embodiments of the present invention.

FIG. 3 shows another embodiment of this invention in which one diode-connected transistor 6 serves as a bias diode for both of the transistors 2 and 7. This permits the number of transistors to be reduced and results in other improvements with respect to the circuit shown in FIG. 2. In the circuit in FIG. 3 a transistor 11 has its base electrode connected to the signal source 1. The transistor 11 is connected as an emitter follower with a relatively high impedance resistor 3 in the emitter lead connecting the emitter transistor 11 to the base of the transistor 7 and to one end of a series circuit comprising the diode-connected transistors 6 and 8. The transistors 2 and 7 are connected in series with the load resistor 5, just as in the circuit in FIG. 2, but the diode-connected transistor 9 is eliminated and, instead, the base of the transistor 2 is connected directly to the common terminal between the diode-connected transistors 6 and 8.

Figure 4:
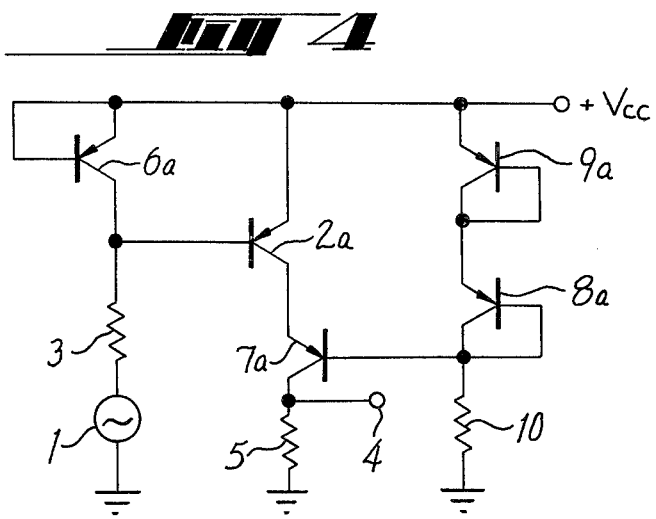

FIG. 4 shows another embodiment virtually identical with the circuit in FIG. 2 except that P-N-P transistors are used in the circuit in FIG. 4 instead of the N-P-N transistors in FIG. 2. Of course, the transistors in the circuit in FIG. 4 are connected in inverse polarity with respect to the power supply. However, the operation of the circuit in FIG. 4 is identical with that in FIG. 2 with the obvious change of polarities.

Figure 5:
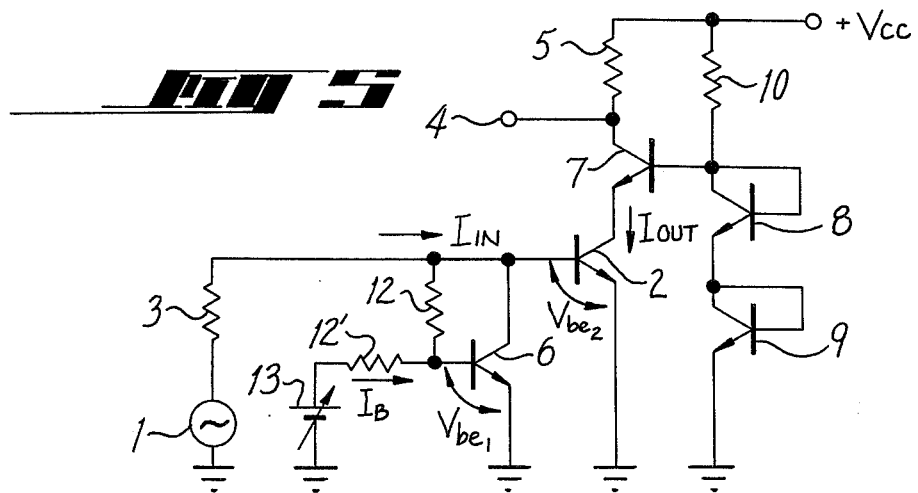
FIGS. 5–8 are schematic diagrams of gain control circuits incorporating signal amplifying circuits according to the present invention.

FIG. 5 shows one embodiment of a gain control circuit that incorporates a signal amplifying circuit according to the present invention. In the circuit in FIG. 5 the components that correspond to those in the circuit in FIG. 2 are identified by the same reference numerals. In addition, there is a resistor 12 connected in series between the collector and base of the transistor 6 and another resistor 12' connected in series with a direct voltage source 13 across the base-emitter terminals of the transistor 6. The source 13 is variable and serves as a control source to control the gain of the circuit. In this circuit, the composite current gain will be varied in response to the magnitude of the control direct voltage of the source 13.

In describing the operation of the circuit in FIG. 5, it will first be assumed that the control direct voltage of the source 13 is reduced to zero. As a result, almost all of the input current $I_{in}$ will flow through the emitter-collector circuit of the transistor 6. The relationship between the voltage $V_{be_1}$ across the base-emitter input terminals of the transistor 6 and the input current $I_{in}$ is given by the general expression:

$$I_{in} \approx I_s \exp \frac{q V_{be_1}}{kT} \qquad (2)$$

in which $k$ is Boltzmann's constant, T is the absolute temperature in degrees Kelvin, $q$ is the charge on an electron, and $I_s$ is the saturation current of the transistor.

Similarly, the equation for the output current $I_{out}$ flowing through the transistor 2 is:

$$I_{out} \approx I_s \exp \frac{q V_{be_2}}{kT} \qquad (3)$$

When the control direct voltage of the source 13 is zero, the voltage $V_{be_1}$ will be substantially equal to the voltage $V_{be_2}$, neglecting the small base current of the transistors 2 and 6. If the control direct voltage of the source 13 is adjusted to provide a positive voltage to the base of the transistor 6, a corresponding current will be caused to flow through the resistors 12 and 12' in a direction to increase the conductivity of the transistor 6. The base-emitter voltage $V_{be_2}$ of the transistor 2 will then be:

$$V_{be_2} = V_{be_1} - R_B I_B \qquad (4)$$

in which $R_B$ is the resistance value of the resistor 12 and $I_B$ is the current flowing through the resistor 12. Inserting the equation (4) into the equation (3), the output $I_{out}$ $$I_{out} = I_s \exp \frac{q (V_{be_1} - R_B I_B)}{kT} \qquad (5)$$

The current gain is defined as follows:

$$\beta = \frac{I_{out}}{I_{in}} = \frac{1}{\exp \frac{q R_B I_B}{kT}} \qquad (6)$$

This means that the current gain $\beta$ can be controlled with stabilized amplification characteristics by varying the current $I_B$ which, in turn, is controlled by the setting of the control direct voltage from the source 13. Moreover, since the potential of the collector of the transistor 2 is held at the diode forward voltage $V_{be}$, this circuit is free from variation of the amplification characteristics due to differences in the integrated circuit device.

Figure 6:
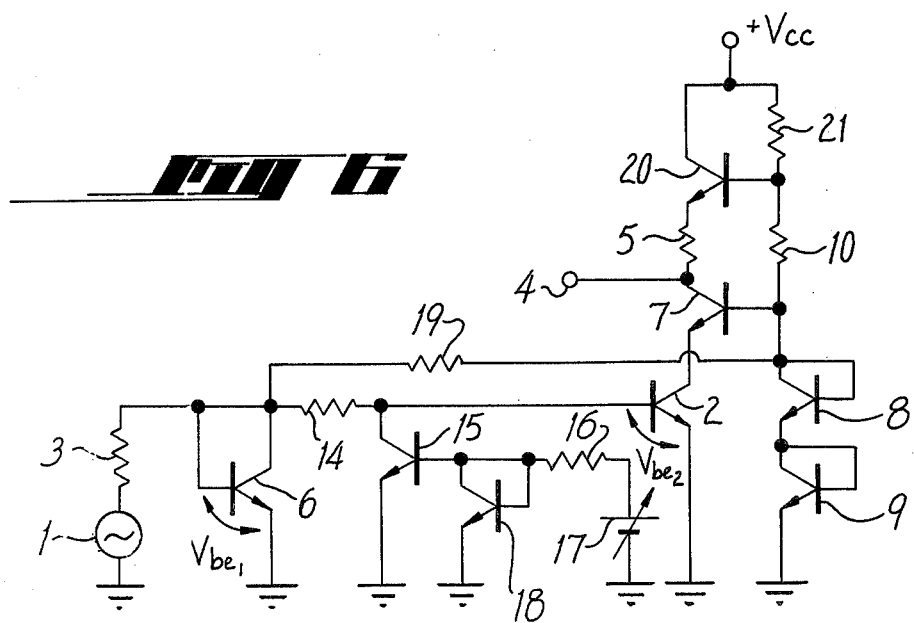

FIG. 6 shows another embodiment of a gain control circuit utilizing a signal amplifying circuit according to the present invention. The reference numerals of components similar to those in the earlier figures are duplicated in FIG. 6. In addition, FIG. 6 includes a control circuit that comprises a resistor 14 connected in series between the base and collector terminals of the transistor 6 and the base of the transistor 2. The emitter-collector circuit of a transistor 15 is connected directly across the base-emitter input circuit of the transistor 2, and a series circuit comprising a relatively high resistance resistor 16 and a variable voltage source 17 is connected between the base of the transistor 15 and ground. Because of the high resistance, the resistor 16 and the source 17 become, in effect, a constant current source. Another diode-connected transistor 18 is connected in parallel with the base-emitter input terminals of the transistor 15. A resistor 19 connects the signal across the transistor 6 to the base of the transistor 7. An additional transistor 20 has its emitter-collector circuit connected in series between the load resistor 5 and the power supply voltage terminal $+V_{cc}$. A bias resistor 21 connects the base of the transistor 20 to the power supply terminal.

In operation, if the voltage of the source 17 is such that the transistor 15 is non-conductive, there is negligible current flow through the resistor 14, and the current through the diode-connected transistor 6 is virtually equal to the current through the emitter-collector output circuits of the transistors 2 and 7. As the voltage of the source 17 increases, current through the transistor 15, which corresponds to current from the source 17, causes a voltage drop across the resistor 14 and changes the gain of the signal from the source 1 as it appears at the output terminal 4.

Figure 7:
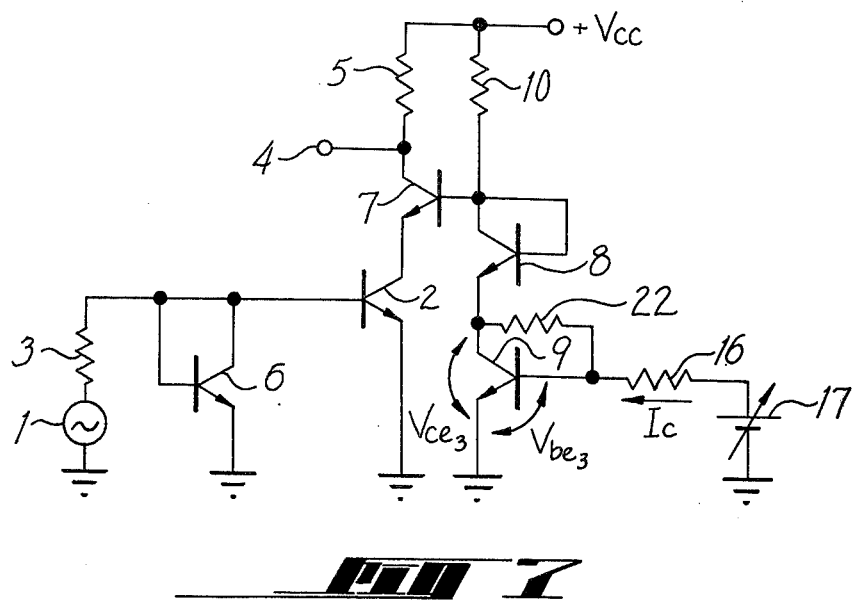

FIG. 7 shows a further embodiment of a gain control circuit according to this invention in which the collector-emitter voltage of the transistor 2 is controlled and thereby the current gain $\beta$ is varied linearly. For this purpose, a resistor 22 is connected between the collector and the base of the transistor 9, and the base of the transistor 9 is also connected through a resistor 16 to a control direct voltage source 17.

In operation, the base bias potential of the transistor 7 is varied in response to the control voltage of the source 17, to control the collector-emitter voltage of the transistor 2. With an increase of the voltage 17, the control current $I_c$ will increase and the voltage across the resistor 22 will also increase and accordingly the collector-emitter voltage $V_{ce_3}$ of the transistor is given as follows:

$$V_{ce_3} = \overline{V}_{be_3} - R_c I_c \qquad (7)$$

in which $\overline{V}_{be_3}$ is the base-emitter voltage of the transistor 9 and $R_c$ is the resistance value of the resistor 22.

In this manner, the collector-emitter voltage of the transistor 9 is reduced by increasing the control current $I_c$ and the collector-emitter voltage of the transistor 2 is also reduced. In response to this variation, the output current $I_{out}$ will decrease and, as a result, the current gain $\beta$ will be reduced in response to the current $I_c$.

Since the collector-base voltage of transistor 2 is varied within a range from $-0.7$ V. to 0 V., the base-emitter voltage versus the emitter current characteristics of the transistor 2 will be substantially equal to that of the transistor 6. Thus, the current gain $\beta$ can also be controlled with stabilized amplification characteristics by varying the control current $I_c$.

Figure 8:
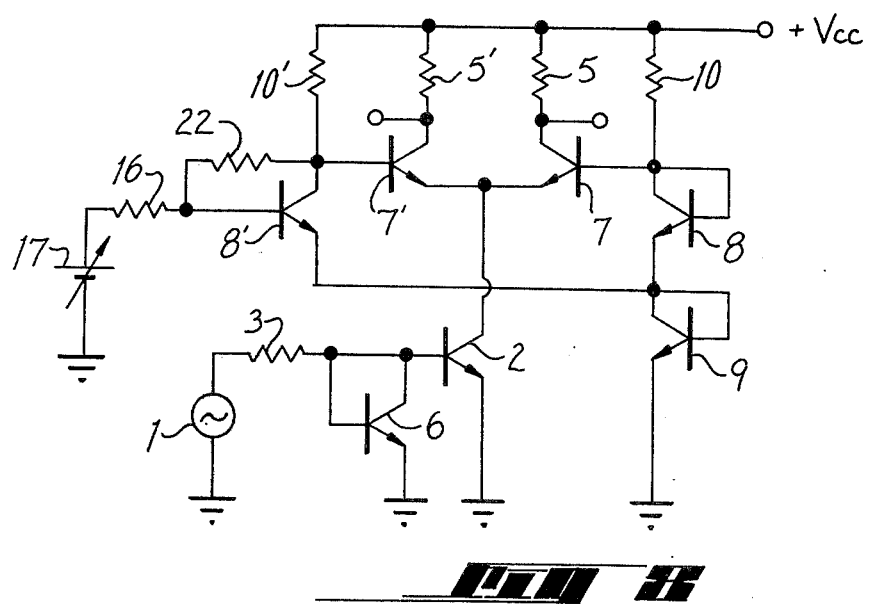

FIG. 8 shows another embodiment of this invention in which the gain of a differential amplifier is controlled regardless of variation of the transistor characteristics. For this purpose, a transistor 7' is connected in parallel with the transistor 7 so as to form the differential amplifier. A bias voltage is supplied to the bases of the transistors 7 and 7', respectively, by means of the diode-connected transistors 8 and 9 and the transistor 8', as shown.

In the circuit of FIG. 8, the collector-emitter voltage of transistor 8' is varied in response to the control voltage of the source 17, in the same manner as the circuit shown in FIG. 7. Thus, the current gain of the differential amplifier is controlled by varying the control voltage of the source 17.

What is claimed is:

1. A signal amplifying circuit, comprising: an amplifying transistor having a base electrode adapted to receive an input signal and a collector-emitter circuit through which an output current flows;
   a compensating transistor having a collector-emitter circuit connected in series to said amplifying transistor collector-emitter circuit, and having a base electrode;
   first reference voltage means including diode means coupled to said amplifying transistor base electrode for applying a first reference voltage to said base electrode of said amplifying transistor, the current flowing in said diode means being a function of said first reference voltage and being equal to said output current in said collector-emitter circuit of said amplifying transistor; and
   second reference voltage means including plural diode means coupled to said compensating transistor base electrode for applying a second reference voltage to said base electrode of said compensating transistor thereby to apply a substantially constant predetermined voltage across said amplifying transistor collector-emitter circuit equal to said second reference voltage less the base-emitter voltage of said compensating transistor.

2. The signal amplifying circuit of claim 1 wherein said diode means in said first reference voltage means comprises a diode-connected transistor connected in parallel with the base-emitter circuit of said amplifying transistor.

3. The signal amplifying circuit of claim 2 wherein said predetermined voltage across said amplifying transistor collector-emitter circuit is equal to the voltage across said diode-connected transistor.

4. The signal amplifying circuit of claim 3 wherein said second reference voltage is equal to substantially twice said first reference voltage.

5. The signal amplifying circuit of claim 1 wherein said diode means in said second reference voltage means comprises two diode-connected transistors in series between said base electrode of said compensating transistor and the emitter electrode of said amplifying transistor.

6. The signal amplifying circuit of claim 5 further comprising a load connected in series with the series-connected collector-emitter circuits of said compensating and amplifying transistors.

7. The signal amplifying circuit of claim 6, further comprising a signal current source comprising a third transistor and a resistor connecting the emitter electrode of said third transistor to the base electrode of said compensating transistor.

8. The signal amplifying circuit of claim 1 comprising, in addition, means for varying said first reference voltage to control the gain of said amplifying transistor.

9. The signal amplifying circuit of claim 8 wherein said first reference voltage means comprises:
   and additional transistor having collector and emitter electrodes connected, respectively, to the base and emitter electrodes of said amplifying transistor; and
   a variable control current source connected between the base and emitter electrodes of said additional transistor.

10. The signal amplifying circuit of claim 9 comprising, in addition, a resistor connected in series between the collector and base terminals of said additional transistor.

11. The signal amplifying circuit of claim 9 comprising, in addition:
   an input signal current source;
   a first resistor connecting said signal current source to said base electrode of said amplifying transistor;
   a diode element connected in forward-biased direction across the base and emitter electrodes of said additional transistor;
   a load, said collector-emitter circuit of said compensating transistor being connected in series between said load and the collector-emitter circuit of said amplifying transistor;
   a further transistor comprising a collector-emitter circuit connected in series between a source of operating voltage and said load;
   a bias circuit comprising a second resistor connected between a fixed voltage source and the base electrode of said further transistor, and a third resistor connnected in series between the base electrode of said further transistor and the base electrode of said compensating transistor; and
   a fourth resistor connected at one end to the junction of said first resistor and said input signal current source and at the other end to the base electrode of said compensating transistor.

12. The signal amplifying circuit of claim 1 comprising, in addition, means for varying said second reference voltage to control the gain of said signal amplifying circuit.

13. The signal amplifying circuit of claim 12 in which said second reference voltage means comprises:
   a diode-connected transistor;
   a fourth transistor having a collector-emitter circuit connected in series with said diode-connected transistor in forward-biased direction between the base electrode of said compensating transistor and the emitter electrode of said amplifying transistor;
   a resistor connected in series between the collector and emitter electrodes of said fourth transistor; and
   a controllable current source connected between the base and emitter electrodes of said fourth transistor.

14. The signal amplifying circuit of claim 1 in which said diode means in said first reference voltage means comprises a first diode element connected across the base-emitter circuit of said amplifying transistor, said diode means in said second reference voltage means comprises second and third diode elements connected in forward-biased series circuit between the base electrode of said compensating transistor and the emitter electrode of said amplifying transistor, said signal amplifying circuit comprising, in addition:
   a second compensating transistor, the emitter electrodes of the first and second compensating transistors being connected to the collector electrode of said amplifying transistor;
   a first load connected between the collector electrode of said first compensating transistor and a power supply terminal;
   a second load connected between the collector electrode of said second compensating transistor and a power supply terminal; and
   a gain control circuit comprising;
   1. a fourth transistor having a collector-emitter circuit connected in conductive direction between the base electrode of said second compensating transistor and the common junction of said second and third diode elements,
   2. a resistor connected in series between the collector and base electrodes of said fourth transistor, and
   3. a controllable current source connected to supply current to the base electrode of said fourth transistor.

* * * * *